(12) United States Patent
Kushiyama

(10) Patent No.: US 6,737,850 B2
(45) Date of Patent: May 18, 2004

(54) POWER SUPPLY VOLTAGE DETECTION CIRCUIT AND POWER SUPPLY VOLTAGE DETECTION METHOD

(75) Inventor: Megumi Kushiyama, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/055,976

(22) Filed: Jan. 28, 2002

(65) Prior Publication Data

US 2002/0101740 A1 Aug. 1, 2002

(30) Foreign Application Priority Data

Jan. 26, 2001 (JP) .......... 2001-019130

(51) Int. Cl.[7] .......... G01R 31/02; H03M 1/00
(52) U.S. Cl. .......... 324/72; 341/141
(58) Field of Search .......... 324/72; 341/141; 364/483; 323/282

(56) References Cited

U.S. PATENT DOCUMENTS

| 5,455,774 A | 10/1995 | Khawand et al. .......... 364/483 |
| 5,675,337 A | * 10/1997 | Moriyama .......... 341/141 |
| 5,698,971 A | 12/1997 | Sahai et al. .......... 323/282 |

FOREIGN PATENT DOCUMENTS

| DE | 35 35 118 | 4/1987 |
| FR | 2 712 986 | 6/1995 |
| JP | A 56-162924 | 12/1981 |
| JP | 64-1971 | 1/1989 |
| JP | U 2-109275 | 8/1990 |
| JP | 4-366782 | 12/1992 |
| JP | 9-27749 | 1/1997 |
| JP | 9-49868 | 2/1997 |
| JP | 10-136579 | 5/1998 |
| JP | 11-51985 | 2/1999 |
| JP | A 11-183532 | 7/1999 |
| JP | 11-223860 | 8/1999 |
| JP | 11-250940 | 9/1999 |
| JP | 2000-329800 | 11/2000 |
| WO | WO 99/27628 | 6/1999 |

* cited by examiner

Primary Examiner—N. Le
Assistant Examiner—Donald M Lair
(74) Attorney, Agent, or Firm—Young & Thompson

(57) ABSTRACT

A power supply voltage detection circuit, includes a constant voltage generator and an A/D converting unit and an A/D conversion result register. The constant voltage generator generates a first voltage of a constant voltage. The A/D converting unit performs an A/D conversion on the first voltage inputted through an analog input channel as a reference voltage of a second voltage of a power supply voltage. The A/D conversion result register stores an A/D conversion result obtained by the A/D converting unit.

8 Claims, 7 Drawing Sheets

POWER SUPPLY VOLTAGE DETECTION CIRCUIT AND POWER SUPPLY VOLTAGE DETECTION METHOD

BACKGROUND OF THE INVENTION

1. Field of the Invention

The present invention relates to a power supply voltage detection circuit and a power supply voltage detection method.

2. Description of the Related Art

An application, such as a micro computer driven by a battery or a computer installed in a car, in which a power supply voltage is changed, is operated on a system in which a power supply voltage is changed since a battery is used as a power supply, as disclosed in Japanese Laid Open Patent Application (JP-A-Heisei 10-136579), Japanese Laid Open Patent Application (JP-A-Heisei 11-223860) and the like. In recent years, a function of not only judging an allowance or rejection with regard to a voltage at one point, but also detecting a continuous power supply voltage is required in detecting a power supply voltage. For example, it is an essential function to indicate in detail the condition that a battery is an empty state, a full state, a middle state and a state close to an exhausted state. A voltage that can be detected by a known constant voltage detection circuit used to detect a power supply voltage is a voltage at only one point. It is difficult to monitor the change in the power supply voltage or its shift. In order to cope with a request of detecting the power supply voltages at a plurality of points necessary for the monitoring of the change and the shift in the power supply voltage, a plurality of detection circuits must be added and installed in a micro computer, in a case of the known circuit. Also, the detection voltage is only set at a time of a design. Thus, it is impossible to satisfy the usage environments and conditions of all users.

In a market in recent years, it is required to monitor the change and the shift in the power supply voltage. However, the conventional detection of the power supply voltage has been performed only on a voltage at one point. It is impossible to monitor the change and the shift in the power supply voltage.

Japanese Laid Open Patent Application (JP-A-Heisei 9-49868) discloses the following apparatus for detecting an exhausted battery. The apparatus for detecting the exhausted battery includes: a constant voltage generator for generating a constant voltage until a usage limit voltage of a battery; and an A/D converter for receiving an operational electric power from an electric power supply line in which it is dropped on the basis of an electric power exhaustion degree of the battery, and performing an A/D conversion on the constant voltage from the constant voltage generator, and it determines that the battery is exhausted if a digital data value into which the constant voltage is converted, on receipt of the A/D conversion value obtained from this A/D converter, is changed by a predetermined value or more.

Japanese Laid Open Patent Application (JP-A-Heisei 11-51985) discloses the following apparatus for detecting a power failure. In this apparatus for detecting the power failure, an A/D converter converts an instantaneous voltage of an alternating power supply into a digital value. A magnitude comparator, if the digital value is equal to or greater than a predetermined threshold, outputs it. An edge detector detects a rising edge and a trailing edge of an output wave form. A timer and an instantaneous power failure detection processor, if a period from the rising edge to the trailing edge (a voltage drop period) exceeds a first time limit T1, determine that it is the instantaneous power failure, and interrupt a main service. If the voltage drop period exceeds a second time limit T2 (T2>T1), they determine that it is the power failure, and carry out a predetermined power failure process. When the electric power is recovered during the instantaneous power failure or the power failure, the process before the power failure is resumed.

Japanese Laid Open Patent Application (JP-A-Heisei 11-250940) discloses the following method of detecting a full charge in a battery charging operation. The method of detecting the full charge in the battery charging operation is carried out by using a |V| detection method of judging, on the basis of a voltage change amount, a process for detecting the full charge based on a software. In any measurement after a detection of a peak voltage in the charging operation, when a battery voltage is dropped from the peak voltage by |V| or more, it is assumed that the full charge is detected. At this time, a time from the detection of the peak voltage to the detection of the full charge is no matter. Also, after the detection of the peak voltage, if the battery voltage is dropped continuously a plurality of times in a periodical measurement, it is assumed to be the detection of the full charge, irrespectively of a drop width. Due to those operations, the detection change width of the battery voltage is expanded, which leads to the easy detection of the full charge. Thus, it is possible to relax an accuracy of an A/D converter for converting the battery voltage.

SUMMARY OF THE INVENTION

The present invention is accomplished in view of the above mentioned problems. Therefore, an object of the present invention is to provide a power supply voltage detection circuit and a power supply voltage detection method that can monitor a change and a shift in a power supply voltage by using an A/D converter as a circuit for detecting a power supply voltage.

Another object of the present invention is to provide a power supply voltage detection circuit and a power supply voltage detection method, in which a potential of a power supply voltage to be detected can be freely set, differently from a constant voltage detection circuit in which the potential is set when it is designed.

In order to achieve an aspect of the objects of the present invention, a power supply voltage detection circuit, includes: a constant voltage generator generating a first voltage of a constant voltage; an A/D converting unit performing an A/D conversion on the first voltage inputted through an analog input channel as a reference voltage of a second voltage of a power supply voltage; and an A/D conversion result register storing an A/D conversion result obtained by the A/D converting unit.

In this case, the power supply voltage detection circuit further includes: a selector selecting the analog input channel of a plurality of analog input channels.

Also in this case, the power supply voltage detection circuit further includes: a result comparison register setting an expectation value of a power supply voltage to be detected; and a judging circuit comparing the A/D conversion result with the expectation value to generate an interruption signal if a detection condition of the power supply voltage is satisfied.

Further in this case, the power supply voltage detection circuit further includes: a result comparison register setting an expectation value of a power supply voltage to be detected; and a judging circuit comparing the A/D conversion result with the expectation value to generate an interruption signal if a detection condition of the power supply voltage is satisfied.

In order to achieve another aspect of the objects of the present invention, a power supply voltage detection circuit, includes: a constant voltage generator generating a first voltage of a constant voltage; and an A/D converting unit inputting the first voltage and a second voltage whose voltage is detected to perform an A/D conversion on the first voltage based on the second voltage, and wherein the power supply voltage detection circuit detects the second voltage based on an A/D conversion result obtained by the A/D converting unit.

In order to achieve still another aspect of the objects of the present invention, a power supply voltage detection circuit, includes: a constant voltage generator generating a first voltage of a constant voltage; a first analog input channel; a second analog input channel, one of the first and second analog input channels inputting the first voltage from the constant voltage generator; a selector selecting an analog input channel of the first and second analog input channels; a reference voltage input terminal inputting a second voltage whose voltage is detected; and an A/D converting unit performing an A/D conversion on a voltage inputted to the analog input channel selected by the selector based on the second voltage, and the power supply voltage detection circuit detects the second voltage based on an A/D conversion result obtained by the A/D converting unit when the first analog input channel is selected by the selector.

In order to achieve yet still another aspect of the objects of the present invention, a power supply voltage detecting method, includes: (a) performing an A/D conversion on a constant voltage of an analog input channel to which the constant voltage generated by a constant voltage generator is applied; and (b) determining a value of a power supply voltage as an inverse operation based on an A/D conversion result obtained when the (a) is performed and a fact that a value of the constant voltage applied to the analog input channel is constant.

In this case, the power supply voltage detecting method further includes: (c) selecting an analog input channel to which a constant voltage generated by the constant voltage generator is applied of a plurality of analog input channels of an A/D converting unit; (d) setting an expectation value of a power supply voltage to be detected in a result comparison register; and (e) performing an A/D conversion on the constant voltage of the analog input channel and comparing the A/D conversion result with the expectation value to generate an interruption signal if a detection condition of the power supply voltage is satisfied.

Also in this case, the power supply voltage detecting method further includes: (f) the expectation value set for the result comparison register is updated every time the interruption signal is generated to monitor a change and a shift in the power supply voltage.

Further in this case, the power supply voltage detecting method further includes: (g) selecting the analog input channel to which the constant voltage generated by the constant voltage generator is applied of the plurality of analog input channels of the A/D converting unit at fixed intervals to monitor a change and a shift in the power supply voltage.

In this case, the power supply voltage detecting method further includes: (g) selecting the analog input channel to which the constant voltage generated by the constant voltage generator is applied of the plurality of analog input channels of the A/D converting unit at fixed intervals to monitor a change and a shift in the power supply voltage.

In order to achieve another aspect of the objects of the present invention, a computer readable recording medium for recording a program for a process, includes: (a) performing an A/D conversion on a constant voltage of an analog input channel to which the constant voltage generated by a constant voltage generator is applied; and (b) determining a value of a power supply voltage as an inverse operation based on an A/D conversion result obtained when the (a) is performed and a fact that a value of the constant voltage applied to the analog input channel is constant.

In this case, the computer readable recording medium for recording a program for a process, further includes: (c) selecting an analog input channel to which a constant voltage generated by the constant voltage generator is applied of a plurality of analog input channels of an A/D converting unit; (d) setting an expectation value of a power supply voltage to be detected in a result comparison register; and (e) performing an A/D conversion on the constant voltage of the analog input channel and comparing the A/D conversion result with the expectation value to generate an interruption signal if a detection condition of the power supply voltage is satisfied.

Also in this case, the computer readable recording medium for recording a program for a process, further includes: (f) the expectation value set for the result comparison register is updated every time the interruption signal is generated to monitor a change and a shift in the power supply voltage.

Further in this case, the computer readable recording medium for recording a program for a process, further includes: (g) selecting the analog input channel to which the constant voltage generated by the constant voltage generator is applied of the plurality of analog input channels of the A/D converting unit at fixed intervals to monitor a change and a shift in the power supply voltage.

In this case, the computer readable recording medium for recording a program for a process, further includes: (g) selecting the analog input channel to which the constant voltage generated by the constant voltage generator is applied of the plurality of analog input channels of the A/D converting unit at fixed intervals to monitor a change and a shift in the power supply voltage.

In order to enable the monitoring of the change and the shift in the power supply voltage that is the above-mentioned object, the power supply voltage detection circuit according to the present invention is characterized in that it includes a constant voltage generator (3) and it applies a constant voltage generated by the constant voltage generator (3) to an analog input channel (5) of an A/D converter (1), and connects a power supply voltage to an AVREF (4) as a reference voltage of the A/D converter (1) and carries out an A/D conversion, and then stores a result of the A/D conversion in an A/D conversion result register (8), and further determines the power supply voltage as an inverse operation since the applied voltage of the analog input channel (5) is constant from the A/D conversion result stored in the A/D conversion result register (8).

It includes a plurality of analog input channels (7) and a selector (6) for selecting one analog input channel from the plurality of analog input channels (7). The selector (6) selects the analog input channel (5), to which the constant voltage generated by the constant voltage generator (3) is applied, of the plurality of analog input channels (7). Then, the A/D conversion is carried out to determine the power supply voltage. The selection of the analog input channel (5) done by the selector (6) is periodically carried out by a CPU. Thus, the execution of the A/D conversion enables the power supply voltage to be continuously determined, and thereby enables the change and the shift in the power supply voltage to be monitored.

A result comparison register (9) for setting an expectation value of a power supply voltage to be detected, and a judging circuit (11) for comparing the A/D conversion result with the expectation value, and generating an interruption signal (10) if a detection condition of the power supply voltage is satisfied are added. Since the result comparison register (9) is installed, it is possible to freely set the expectation value of the power supply voltage to be detected. It is also possible to perform a predetermined process, such as an information escape and the like, on the power supply voltage detected from the generation of the interruption signal (10). After the completion of the predetermined process to the detected power supply voltage, an expectation value is newly set for the result comparison register (9), and a power supply voltage to the new expectation value is detected. An expectation value set for the result comparison register (9) is updated after each completion of the predetermined process to the detected power supply voltage. Then, the detection of the power supply voltage is repeated. Accordingly, it is possible to monitor the change and the shift in the power supply voltage.

DESCRIPTION OF THE PREFERRED EMBODIMENTS

Figure 1:
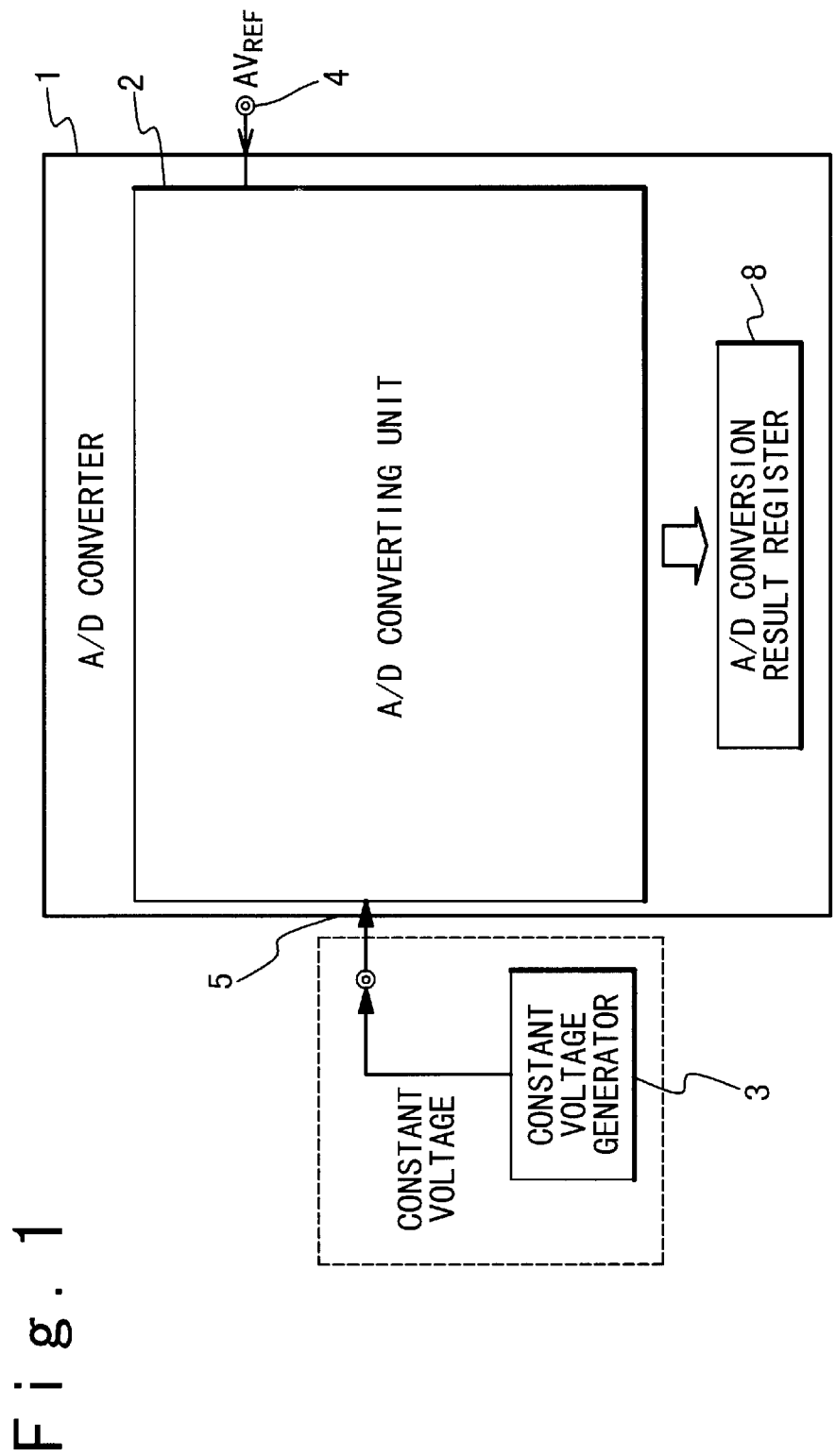
FIG. 1 is a circuit block diagram showing an embodiment of a power supply voltage detection circuit according to the present invention.

Embodiments of the present invention will be described below with reference to the attached drawings. In FIG. 1, a power supply voltage detection circuit according to the present invention includes a constant voltage generator 3. It applies a constant voltage generated by the constant voltage generator 3 to an analog input channel 5 of an A/D converter 1, and connects a power supply voltage, in which a change and a shift in a voltage is desired to be detected, to an AVREF 4. The A/D converter 1 performs an A/D conversion on the voltage applied to the analog input channel 5 as a reference voltage of the A/D converter 1 with regard to the AVREF 4, and stores a result of the A/D conversion in an A/D conversion result register 8.

The result of the A/D conversion is the conversion result of the voltage applied to the analog input channel 5. However, the power supply voltage connected to the AVREF 4 can be determined as an inverse operation since the voltage applied to the analog input channel 5 is constant.

Figure 2:
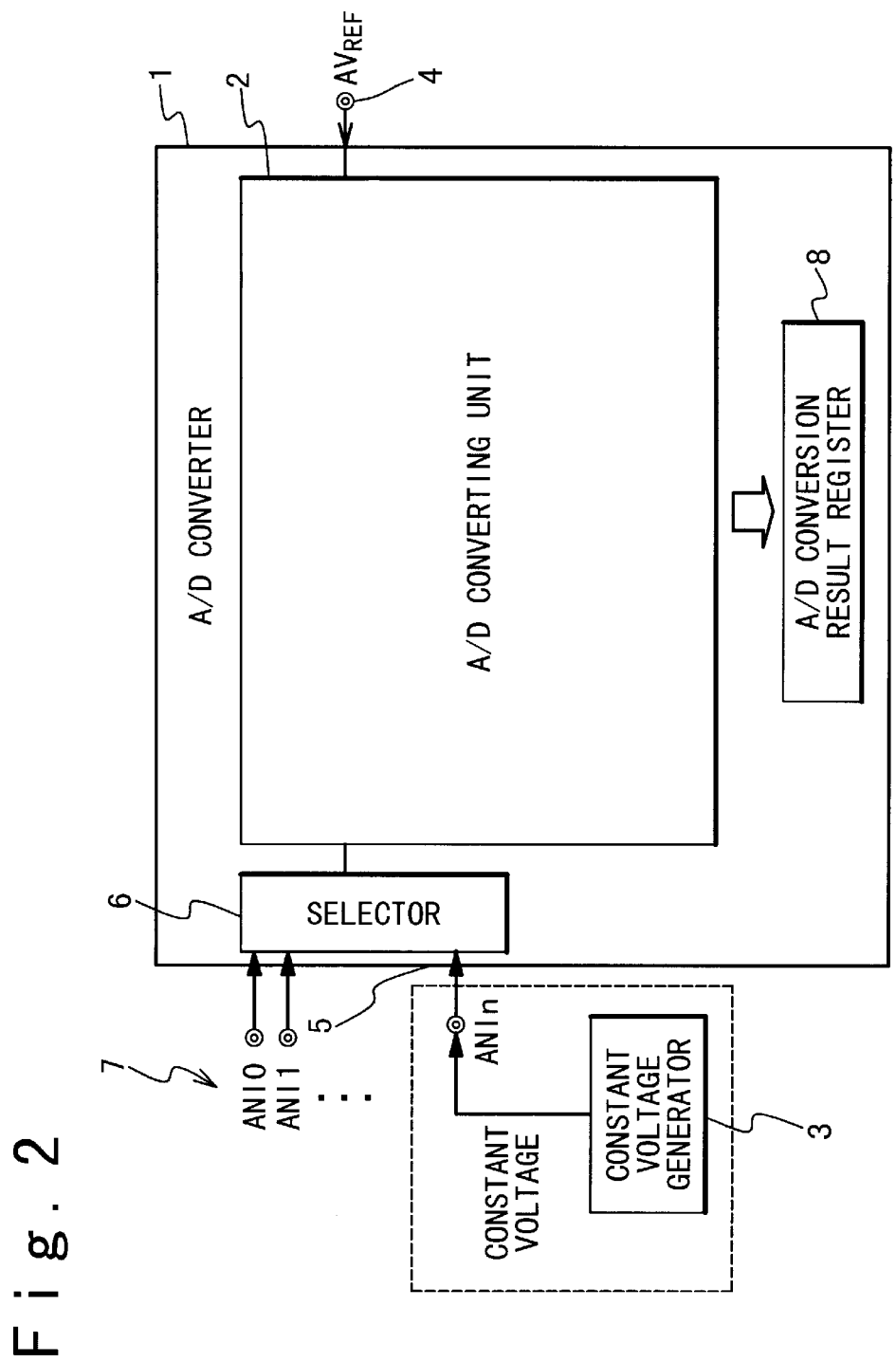
FIG. 2 is a circuit block diagram showing another embodiment of the power supply voltage detection circuit according to the present invention.

FIG. 2 is the power supply voltage detection circuit according to the present invention that includes: a plurality of analog input channels 7 to which a plurality of signals are respectively inputted in the embodiment of FIG. 1; and a selector 6 for selecting one analog input channel from the plurality of analog input channels 7. The selector 6 selects the analog input channel 5 to which the constant voltage from the plurality of analog input channels 7 of the A/D converter 1 is applied. Then, while the AVREF 4 connected to the power supply voltage is used as the reference voltage, the A/D conversion can be carried out to thereby determine the power supply voltage from the result of the A/D conversion.

In this embodiment, the selector 6 periodically selects the analog input channel 5, on the basis of a control of a CPU, from the plurality of analog input channels 7 of the A/D converter installed to carry out the A/D conversion in an application. The A/D conversion is periodically performed on the voltage applied to the selected analog input channel 5, by using as the reference voltage the AVREF 4 to which the power supply voltage is applied. The power supply voltage can be determined as the inverse operation from the conversion result periodically obtained as mentioned above. As a result, it is possible to monitor the change in the power supply voltage. The plurality of analog input channels 7 besides the analog input channel to which the constant voltage is applied is the analog input channel to be used when the A/D converter is used in the application.

Figure 3:
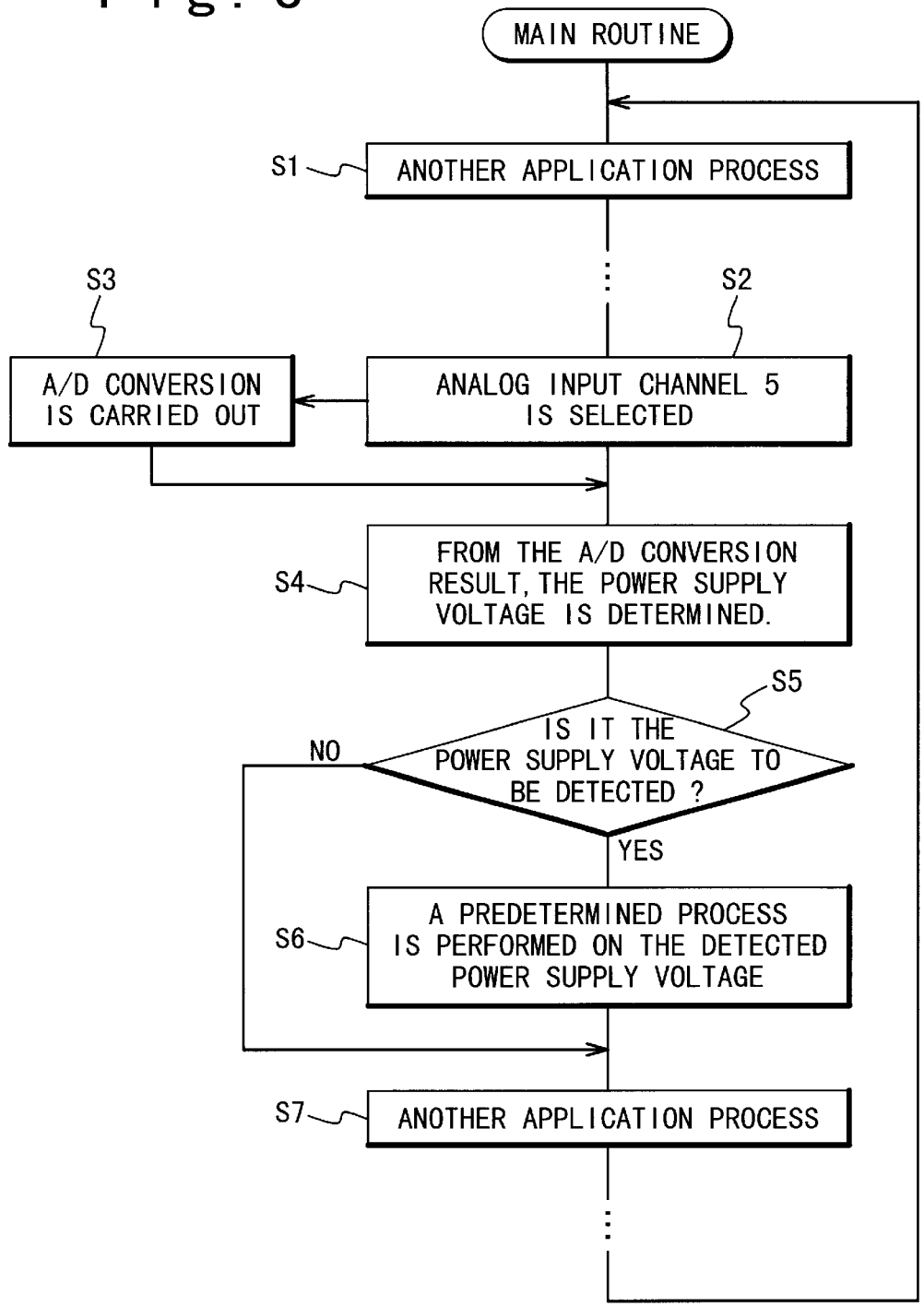
FIG. 3 is a flowchart showing a power supply voltage detection method according to the present invention.

FIG. 3 is a flowchart with regard to the embodiment of FIG. 2. If the A/D is not used in the application after a start of a main routine, another application process (S1) is carried out. However, if the CPU periodically selects the analog input channel 5 (S2), the A/D conversion is carried out (S3) by using the constant voltage, which is generated by the constant voltage generator 3 and applied to the analog input channel 5, and the AVREF 4 connected to the power supply voltage, as the reference voltage of the A/D converter 1. From the A/D conversion result, since the voltage applied to the analog input channel 5 is constant, it is possible to determine the power supply voltage connected to the AVREF 4 as the inverse operation (S4). If it is the power supply voltage to be detected (S5), a predetermined process is performed on the detected power supply voltage (S6). Then, another application process (S7) is carried out, and the operational flow returns back to S1. If it is not the value of the power supply voltage to be detected after the A/D conversion, the predetermined process (S6) is not done, and another application process (S7) is carried out. Then, the operational flow returns back to S1.

Figure 4:
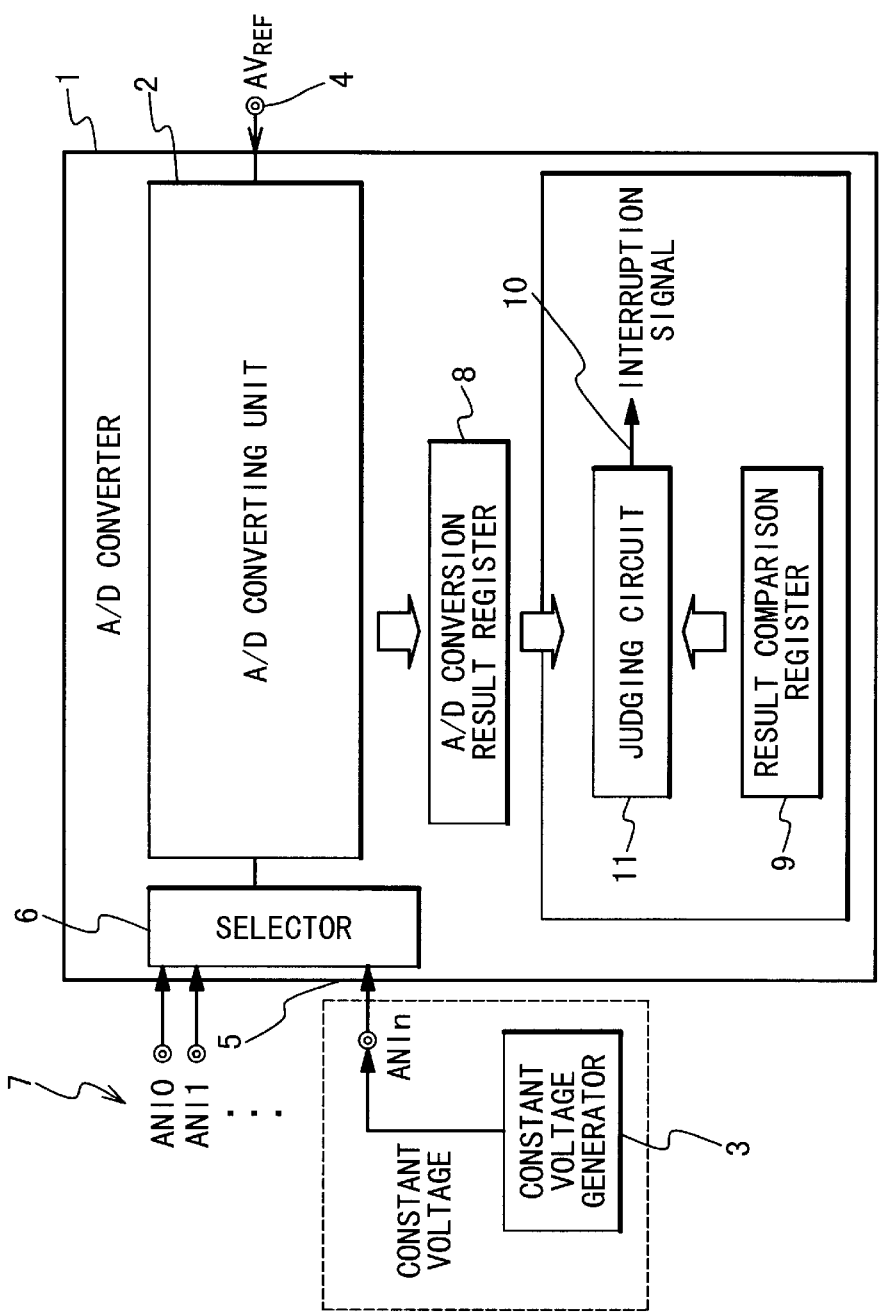
FIG. 4 is a circuit block diagram showing still another embodiment of the power supply voltage detection circuit according to the present invention.

FIG. 4 is the power supply voltage detection circuit according to the present invention, which further includes: a result comparison register 9 for setting an expectation value of a power supply voltage to be detected; and a judging circuit 11 for comparing the A/D conversion result with the expectation value, and generating an interruption signal 10 if a detection condition of the power supply voltage is satisfied. The A/D conversion result register 8 and the result comparison register 9 are connected to the judging circuit 11. The judging circuit 11 compares the A/D conversion result stored in the A/D conversion result register 8 with the expectation value set for the result comparison register 9, and generates the interruption signal 10 if the detection condition of the power supply voltage is satisfied.

The selector 6 selects the analog input channel 5 to which the constant voltage generated by the constant voltage generator 3 is applied, from the plurality of analog input channels 7 of the A/D converter 1. Then, the A/D conversion is done by an A/D converting unit 2 by using the AVREF 4 connected to the power supply voltage as the reference voltage of the A/D converter 1. The A/D conversion result stored in the A/D conversion result register 8 is compared with the expectation value set for the result comparison register 9. If the detection condition of the power supply voltage is satisfied, the interruption signal 10 is generated so as to perform the predetermined process on the detected power supply voltage. The expectation value set for the result comparison register 9 is updated after each completion of the predetermined process to the detected power supply voltage. Then, the detection of the power supply voltage is repeated. Accordingly, it is possible to monitor the change and the shift in the power supply voltage.

Figure 5:
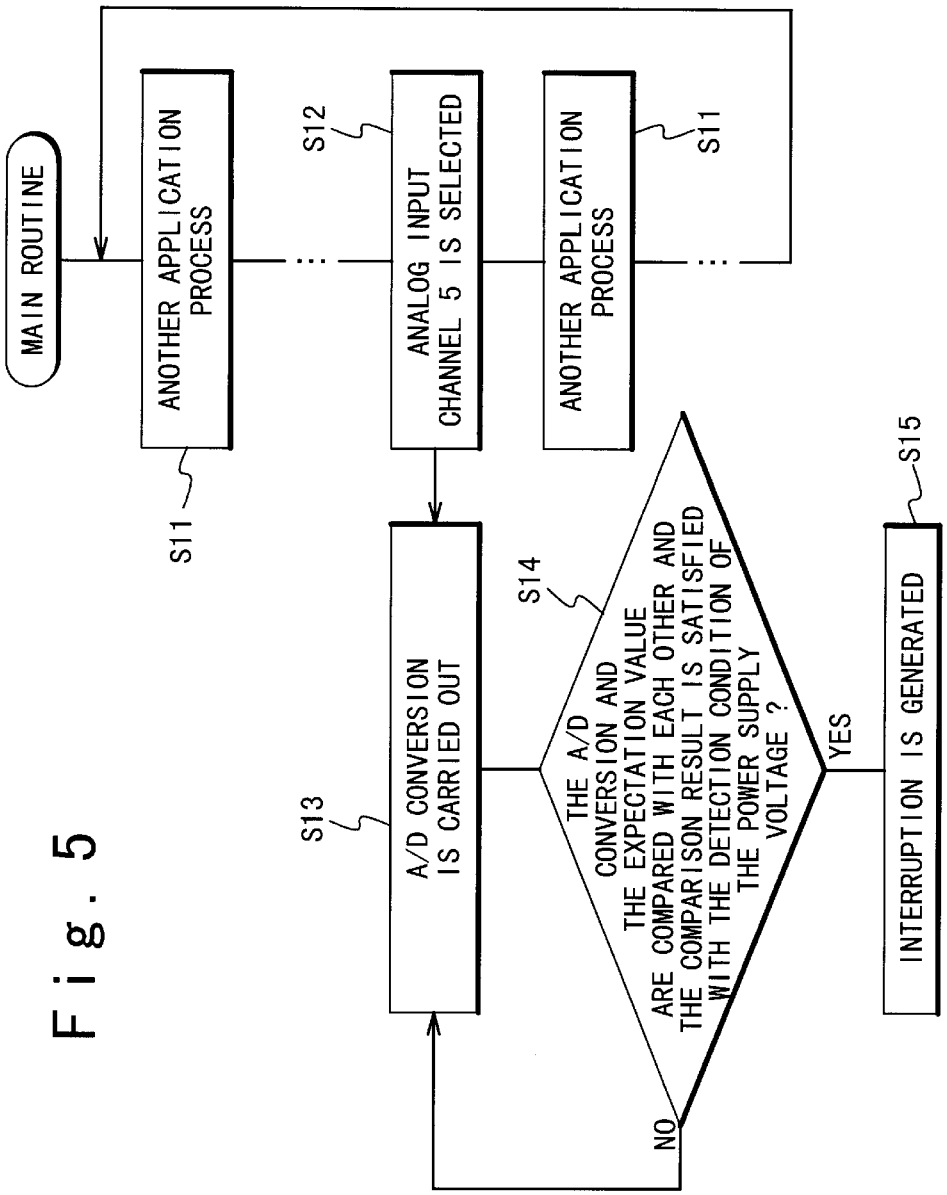
FIG. 5 is a flowchart showing another embodiment of the power supply voltage detection method according to the present invention.

FIG. 5 is a flowchart with regard to the embodiment of FIG. 4. If the A/D is not used in the application after the start of the main routine, another application process (S11) is carried out. However, if the CPU selects the analog input channel 5 from the plurality of analog input channels 7 of the A/D converter 1 (S12), the A/D conversion is carried out (S13) by using the constant voltage, which is generated by the constant voltage generator 3 and applied to the analog input channel 5, and the AVREF 4 connected to the power supply voltage, as the reference voltage of the A/D converter 1. The A/D conversion and the expectation value set for the result comparison register 9 are compared with each other (S14). If the detection condition of the power supply voltage is satisfied, an interruption is generated by the judging circuit 11 (S15). In this case, there are two detection conditions of a case of the A/D conversion result≧the expectation value and a case of the A/D conversion result≦the expectation value. Those conditions can be selected by the register and the like.

Figure 6:
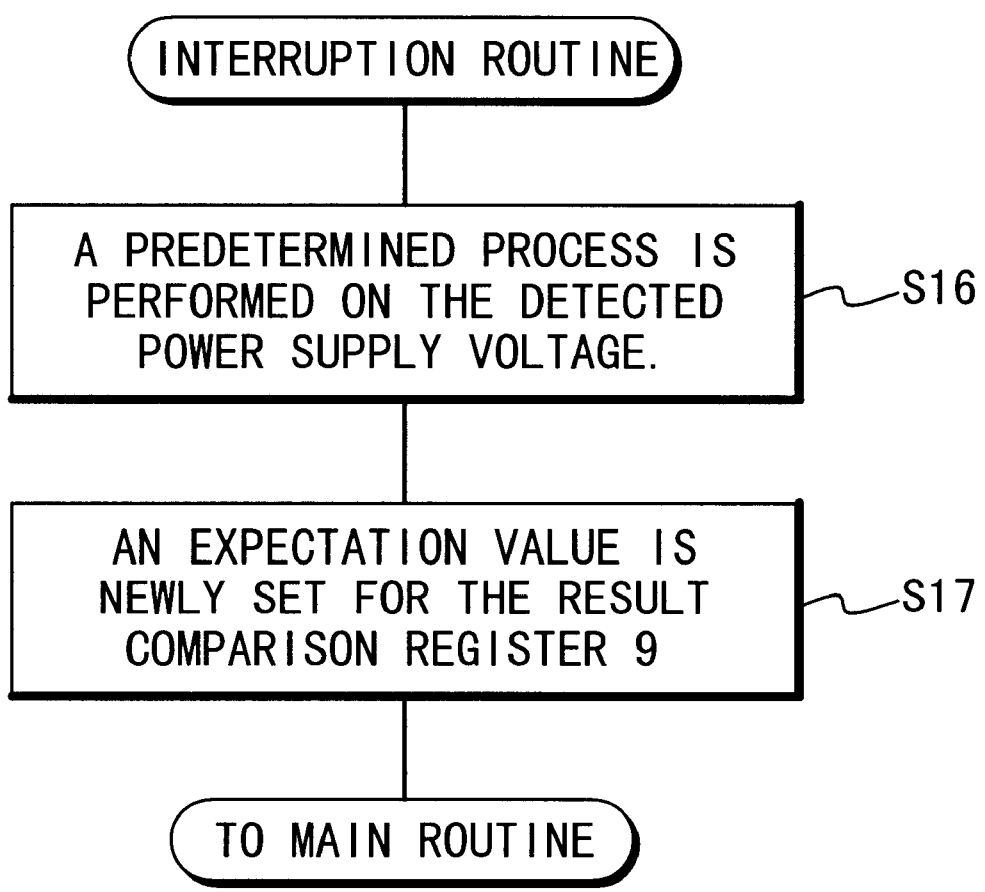
FIG. 6 is a flowchart showing an interruption routine of the embodiment of the power supply voltage detection method according to the present invention.

FIG. 6 shows an interruption routine. If the interruption is generated (S15), a predetermined process (S16) is performed on the detected power supply voltage. An expectation value is newly set for the result comparison register 9 (S17). The operational flow returns back to the main routine. After the return to the main routine, a power supply voltage is detected correspondingly to the new expectation value. After the completion of the predetermined process performed on the detected power supply voltage, the expectation value set for the result comparison register 9 is updated for each completion. The operation of the A/D conversion is repeated, and the detection of the power supply voltage is repeated. Thus, it is possible to monitor the change and the shift in the power supply voltage.

Figure 7:
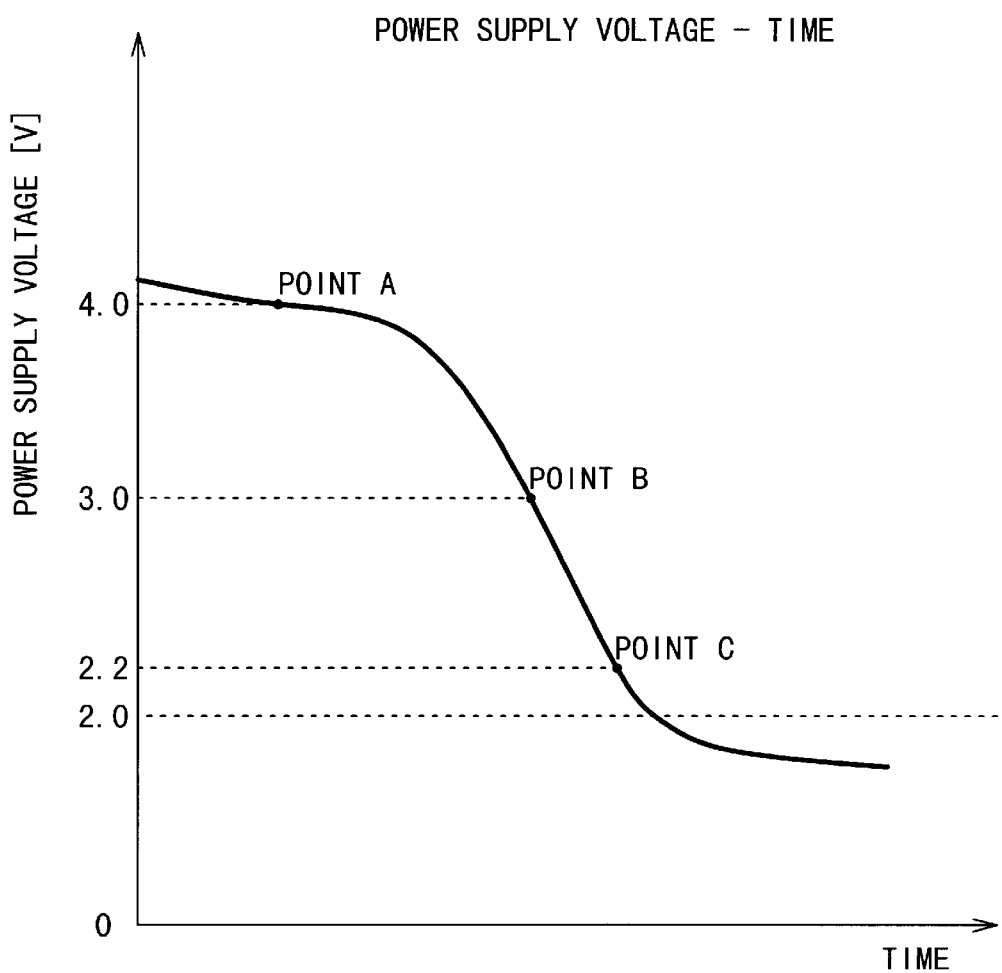
FIG. 7 is a graph showing a temporal change of a power supply voltage in the power supply voltage detection method according to the present invention.

The actual example in which the power supply voltage is detected under the following condition in an application of a drop in the power supply voltage will be described below with reference to FIG. 7. An 8-bit A/D converter applies a constant voltage of 2.0 V generated by the constant voltage generator 3 to the analog input channel 5. By the way, as the constant voltage generator, for example, it is possible to use a regulator circuit provided with a band gap circuit and an operational amplifier. At this time, the regulator circuit generates the constant voltage (here, 2.0 V) lower than the power supply voltage. The 8-bit A/D converter performs the A/D conversion on the constant voltage applied to the analog input channel 5 with the power supply voltage as the reference voltage. If an A/D conversion result at a point A becomes at 7FH as the power supply voltage is dropped, it can be determined that a potential of the analog input channel after the A/D conversion is 2.0 V and constant and that the reference voltage of the A/D converter, namely, the power supply voltage is 4.0 V as the inverse operation from the A/D conversion result of 7FR.

In view of the above explanations, an actual example in which the power supply voltage is detected under the following condition is described. In the 8-bit A/D converter, it is assumed that the constant voltage generated by the constant voltage generator 3 is 2.0 V, the power supply voltage to be detected is 2.2 V, and the detection condition of the power supply voltage is the A/D conversion result≧the expectation value. The A/D conversion value in the detection is at F0H from the above-mentioned relation between the A/D conversion result and the power supply voltage. Thus, the expectation value to the result comparison register is set at F0H. Unless the CPU selects a component except the analog input channel 5, the A/D conversion of the analog input channel 5 is carried out (S13). The A/D conversion result is compared with the expectation value F0H set for the result comparison register. For example, since the power supply voltage at the point A is 4.0 V, the A/D conversion result is at 7FH. Since it is not the detection condition, the A/D conversion is done in succession. Even at a point B, the power supply voltage is 3.0 V, and the A/D conversion result is at AAH. Since it is not the detection condition, the A/D conversion is done in succession. If the A/D conversion result≧F0H and the detection condition of the power supply voltage of 2.2 V is satisfied, the interruption is generated by the judging circuit 11 (S15).

In succession, another detection method is described in which the power supply voltage is detected under the following condition. In the 8-bit A/D converter, it is assumed that the constant voltage generated by the constant voltage generator 3 is 2.0 V, the detection condition of the power supply voltage is the A/D conversion result≧the expectation value, and as the power supply voltage to be detected, a point A is at 4.0 V, a point B is at 3.0 V, and a point C is 2.2 V. Thus, as the expectation values at the respective points, the point A is at 7FH, the point B is at AAH, and the point C is at F0H. At first, 7FH is set for the result comparison register 9. Until the A/D conversion result becomes at 7FH, unless the CPU selects the component except the analog input channel 5, the A/D conversion of the analog input channel 5 is carried out (S13). If the A/D conversion result≧7FH, the interruption is generated (S15). In the interruption routine, a predetermined process is performed on the power supply voltage of 4.0 V (S16). A new expectation value AAH is set for the result comparison register 9 (S17). The operational flow returns back to the main routine. Hereafter, the operations similar to those of the method of detecting the power supply voltage of 4.0 V are repeated to then detect the power supply voltages of 3.0 V and 2.2 V. This repetition of the detection of the power supply voltage enables the change and the shift in the power supply voltage to be monitored.

According to the power supply voltage detection circuit and the power supply voltage detection method of the present invention, it is possible to monitor the change and the shift in the power supply voltage.

What is claimed is:

1. A power supply voltage detection circuit, comprising:
   a constant voltage generator generating a first voltage of a constant voltage;
   a first analog input channel;
   a second analog input channel, one of said first and second analog input channels inputting said first voltage from said constant voltage generator;

a selector selecting an analog input channel of said first and second analog input channels;

a reference voltage input terminal inputting a second voltage whose voltage is detected; and an A/D converting unit performing an A/D conversion on a voltage inputted to said analog input channel selected by said selector based on said second voltage, and said power supply voltage detection circuit detects said second voltage based on an A/D conversion result obtained by said A/D converting unit when said first analog input channel is selected by said selector.

2. A power supply voltage detecting method, comprising:

(a) performing an A/D conversion on a constant voltage of an analog input channel to which said constant voltage generated by a constant voltage generator is applied;

(b) determining a value of a power supply voltage as an inverse operation based on an A/D conversion result obtained when said (a) is performed and a fact that a value of said constant voltage applied to said analog input channel is constant;

(c) selecting an analog input channel to which a constant voltage generated by said constant voltage generator is applied of a plurality of analog input channels of an A/D converting unit;

(d) setting an expectation value of a power supply voltage to be detected in a result comparison register; and (e) performing an A/D conversion on said constant voltage of said analog input channel and comparing said A/D conversion result with said expectation value to generate an interruption signal if a detection condition of said power supply voltage is satisfied.

3. A power supply voltage detecting method according to claim 2, further comprising:

(f) updating said expectation value set for said result comparison register every time said interruption signal is generated to monitor a change and a shift in said power supply voltage.

4. A power supply voltage detecting method according to claim 2, further comprising:

(g) selecting said analog input channel to which said constant voltage generated by said constant voltage generator is applied of said plurality of analog input channels of said A/D converting unit at fixed intervals to monitor a change and a shift in said power supply voltage.

5. A computer readable recording medium for recording a program for a process, comprising:

(a) performing an A/D conversion on a constant voltage of an analog input channel to which said constant voltage generated by a constant voltage generator is applied;

(b) determining a value of a power supply voltage as an inverse operation based on an A/D conversion result obtained when said (a) is performed and a fact that a value of said constant voltage applied to said analog input channel is constant;

(c) selecting an analog input channel to which a constant voltage generated by said constant voltage generator is applied of a plurality of analog input channels of an A/D converting unit;

(d) setting an expectation value of a power supply voltage to be detected in a result comparison register; and (e) performing an A/D conversion on said constant voltage of said analog input channel and comparing said A/D conversion result with said expectation value to generate an interruption signal if a detection condition of said power supply voltage is satisfied.

6. A computer readable recording medium for recording a program for a process according to claim 5, further comprising:

(f) said expectation value set for said result comparison register is updated every time said interruption signal is generated to monitor a change and a shift in said power supply voltage.

7. A computer readable recording medium for recording a program for a process according to claim 6, further comprising:

(g) selecting said analog input channel to which said constant voltage generated by said constant voltage generator is applied of said plurality of analog input channels of said A/D converting unit at fixed intervals to monitor a change and a shift in said power supply voltage.

8. A computer readable recording medium for recording a program for a process according to claim 5, further comprising:

(g) selecting said analog input channel to which said constant voltage generated by said constant voltage generator is applied of said plurality of analog input channels of said A/D converting unit at fixed intervals to monitor a change and a shift in said power supply voltage.

* * * * *